United States Patent
Chen et al.

[11] Patent Number: 6,159,660
[45] Date of Patent: Dec. 12, 2000

[54] OPPOSITE FOCUS CONTROL TO AVOID KEYHOLES INSIDE A PASSIVATION LAYER

[75] Inventors: Hsin-Pai Chen; An-Min Chiang; Pei-Hung Chen, all of Hsin-Chu, Taiwan

[73] Assignee: Taiwan Semiconductor Manufacturing Company Ltd., Hsin-Chu, Taiwan

[21] Appl. No.: 08/794,694

[22] Filed: Feb. 3, 1997

[51] Int. Cl.[7] ................................................. G03F 7/207
[52] U.S. Cl. ........................... 430/313; 430/318; 430/327
[58] Field of Search ...................................... 430/313, 318, 430/314, 327, 36

[56] References Cited

U.S. PATENT DOCUMENTS

| | | | |
|---|---|---|---|
| 5,286,608 | 2/1994 | Koh | 430/313 |
| 5,362,585 | 11/1994 | Adams | 430/30 |
| 5,439,767 | 8/1995 | Yamashita et al. | 430/30 |
| 5,447,810 | 9/1995 | Chen et al. | 430/5 |
| 5,496,669 | 3/1996 | Pforr et al. | 430/22 |
| 5,663,599 | 9/1997 | Lur | 257/750 |
| 5,691,215 | 11/1997 | Dai et al. | 437/44 |
| 5,702,869 | 12/1997 | Chien et al. | 430/313 |
| 5,721,608 | 2/1998 | Taniguchi | 355/53 |

FOREIGN PATENT DOCUMENTS 363261836  10/1988  Japan .
63-261836  10/1988  Japan .

OTHER PUBLICATIONS

Translation of JP 63–261836 published Oct. 28, 1988.

*Primary Examiner*—Kathleen Duda
*Attorney, Agent, or Firm*—George O. Saile; Stephen B. Ackerman; Larry J. Prescott

[57] ABSTRACT

A method of forming a number of closely spaced electrodes is described wherein covering the electrodes with a conformal layer of oxide or nitride deposited using plasma enhanced chemical vapor deposition does not result in the formation of restricted regions or keyholes between adjacent electrodes. The method uses de-focussing to form the electrode mask pattern in a layer of photoresist. The focal plane in which the electrode pattern is focussed is positioned a de-focus distance above the layer of photoresist. The de-focus method results in electrodes having a trapezoidal cross section wherein the bottom of the electrode is wider than the top of the electrode. The trapezoidal cross section avoids the formation of restricted regions or keyholes when the electrodes are covered with a conformal dielectric layer, such as a layer of oxide or nitride deposited using plasma enhanced chemical vapor deposition.

12 Claims, 5 Drawing Sheets

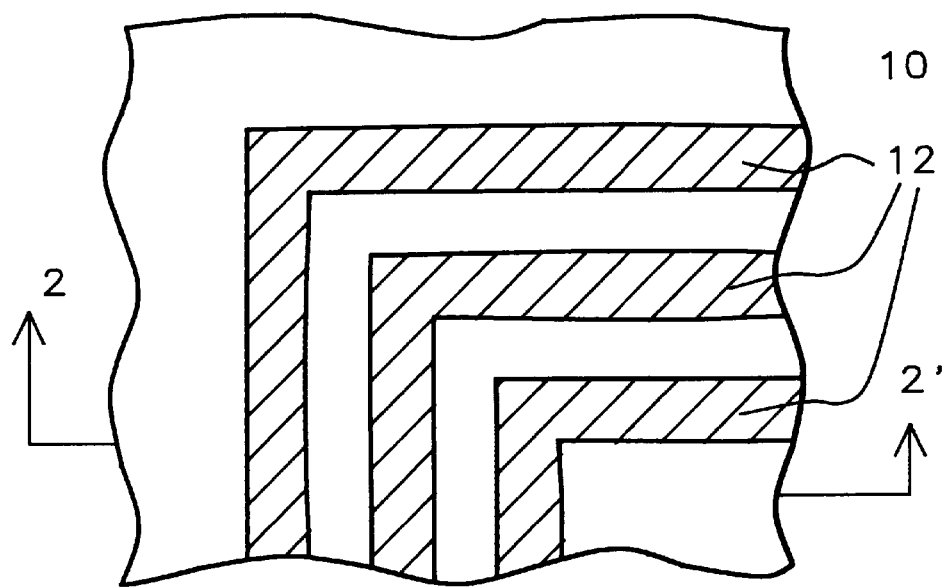
FIG. 1 - Prior Art
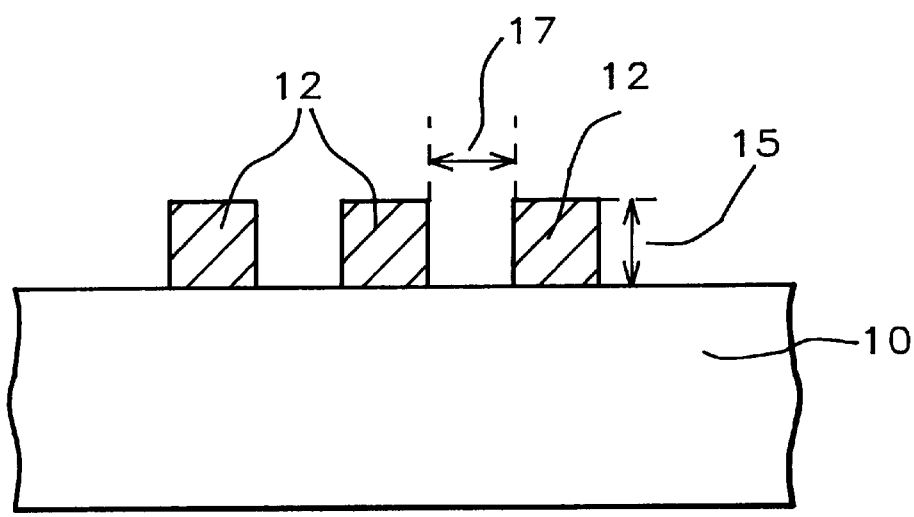
FIG. 2 - Prior Art

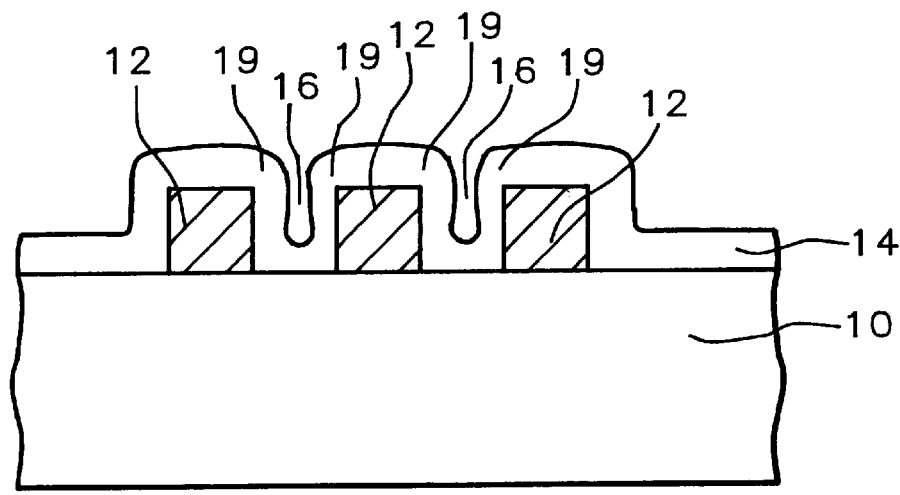
FIG. 3 - Prior Art
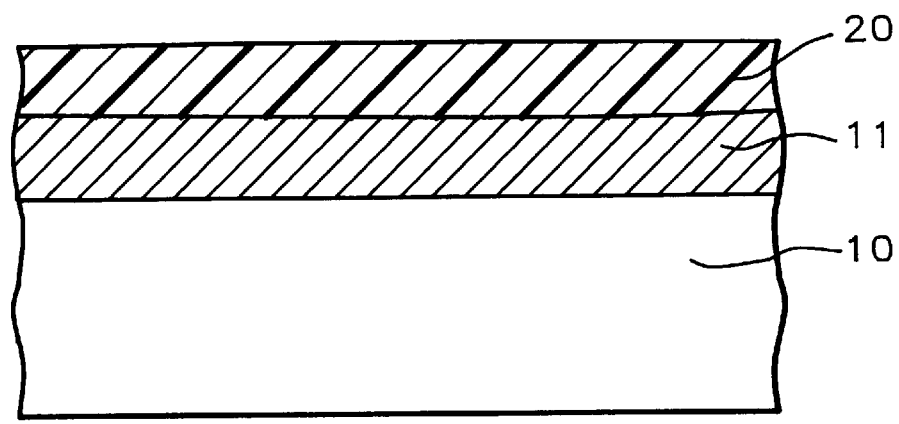
FIG. 4

OPPOSITE FOCUS CONTROL TO AVOID KEYHOLES INSIDE A PASSIVATION LAYER

BACKGROUND OF THE INVENTION (1) Field of the Invention

This invention relates to de-focussing the electrode pattern image used to selectively expose a layer of photoresist in order to form an electrode pattern mask. The electrode pattern mask results in electrodes having a trapezoidal cross section and keyholes are avoided.

(2) Description of the Related Art

In the manufacture of integrated circuit wafers photolithographic steps are frequently used to transfer an electrode pattern comprising a number of closely spaced electrodes from an electrode pattern mask to a metal conductor layer using a photoresist mask. To form the photoresist mask the electrode pattern must be focussed on a layer of photoresist to selectively expose the layer of photoresist. After the electrodes have been formed conformal dielectric layer is formed over the electrodes. Restricted regions, or keyholes, often form in the dielectric layer causing problems in later processing steps.

U.S. Pat. No. 5,496,669 to Pforr et al. describes a system comprising a latent image detection device which can detect the coincidence of mask alignment features. A focus test pattern on the product wafer is used to allow measurement of substrate height and focus.

U.S. Pat. No. 5,447,810 to Chen et al. describes a mask and method of using off-axis illumination to provide increased depth of focus and minimize critical dimension differences between certain features.

U.S. Pat. No. 5,362,585 to Adams describes a method to achieve good stepper focus and exposure over an entire wafer for a particular wafer before a product run is started.

U.S. Pat. No. 5,439,767 to Yamashita et al. describes a method of measuring the transmittance error and the phase shift angle error of a phase shift mask.

TSMC-96-181, Ser. No. 08/803,352, Filed Feb. 20, 1997, Entitled "A System for In-Line Monitoring of Photo Processing De-Focus and Image Tilt in VLSI Fabrication," assigned to the same assignee, describes a de-focus test pattern and a method for in-line monitoring of photo processing steps in the fabrication of integrated circuit wafers.

This invention describes a method of intentionally de-focussing the image of an electrode pattern mask used to selectively expose a layer of photoresist. The resulting electrode pattern has a trapezoidal cross section. A conformal dielectric coating is then used to passivate the electrode pattern. Restricted regions and keyholes in the dielectric coating are avoided.

SUMMARY OF THE INVENTION

In the manufacture of integrated circuit wafers it is frequently required to form a number of closely spaced electrodes which are then covered by a passivation layer. The passivation layer often comprises a conformal dielectric coating such as an oxide or nitride layer deposited using plasma enhanced chemical vapor deposition. One of the problems encountered when the electrodes are close together, such as when the ratio of the separation distance between adjacent electrodes to the height of the electrodes is less than about one, is that overhang of the dielectric coating at the top of the electrode can form restricted regions, often called keyholes, between adjacent electrodes. Residues of processing materials, such as for photolithographic steps, can become trapped in the keyholes and lead to problems with subsequent processing steps.

Refer to FIGS. 1–3 for description of the restricted regions, or keyholes. FIG. 1 shows a top view of a part of an integrated circuit wafer 10 having devices formed therein, not shown, and a number of electrodes 12 formed thereon. FIG. 2 shows a cross section of a part of the integrated circuit wafer along the line 2-2' of FIG. 1. The ratio of the separation distance 17 between adjacent electrodes to the height 15 of the electrodes is less than about one. As shown in FIG. 3, a conformal layer of dielectric 14, such as a layer of oxide or nitride deposited using plasma enhanced chemical vapor deposition, results in an overhang 19 at the top of the electrodes. The overhang 19 forms restricted regions 16, or keyholes, in the spaces between adjacent electrodes. Processing materials, such as photoresist residue, can become trapped and expand during later processing steps thereby damaging electrodes. Trapped residues are also a problem for the reliability of the integrated circuit wafers.

It is a principle objective of this invention to provide a method of forming electrodes and dielectric coatings over the electrodes which avoids the problem of restricted regions, or keyholes.

It is another principle objective of this invention to provide a structure of electrodes and dielectric coatings over the electrodes which avoids the problem of restricted regions, or keyholes.

These objectives are achieved by de-focussing slightly the electrode image pattern on the photoresist layer used to form the electrode pattern. This de-focussing results in electrodes having a trapezoid shaped cross section wherein the bottom of the electrode is wider than the top of the electrode. This trapezoidal electrode cross section avoids the formation of restricted regions, or keyholes, and the problems caused by keyholes are avoided.

BRIEF DESCRIPTION OF THE DRAWINGS

FIG. 1 shows a top view of part of an integrated circuit wafer having a number of closely spaced electrodes.

FIG. 2 shows a cross section, along the line 2-2' of FIG. 1, of part of an integrated circuit wafer having a number of closely spaced electrodes.

FIG. 3 shows a cross section of part of an integrated circuit wafer after deposition of a conformal dielectric layer showing the formation of keyholes.

FIG. 4 shows a cross section of part of an integrated circuit wafer after deposition of a layer of conducting material and a layer of photoresist.

DESCRIPTION OF THE PREFERRED EMBODIMENTS

Refer now to FIGS. 3–7 for a detailed description of the preferred embodiment of this invention. FIG. 4 shows a cross section view of an integrated circuit wafer 10 having devices formed therein, not shown. There may be dielectric and conductor pattern layers formed on the wafer 10 which are not shown. A layer of conductor material 11; such as aluminum, aluminum/copper, or aluminum/copper/silicon; is deposited over the integrated circuit wafer 10, forming a so-called top metal layer. An electrode pattern having a number of electrodes with small spacing between electrodes, such as shown in FIG. 1, is to be etched into the layer of conductor material 11. The space between adjacent electrodes is between about 0.9 and 1.1 micrometers. To form the electrode pattern a layer of photoresist 20 is then formed over the layer of conductor material 20.

Figure 5A:
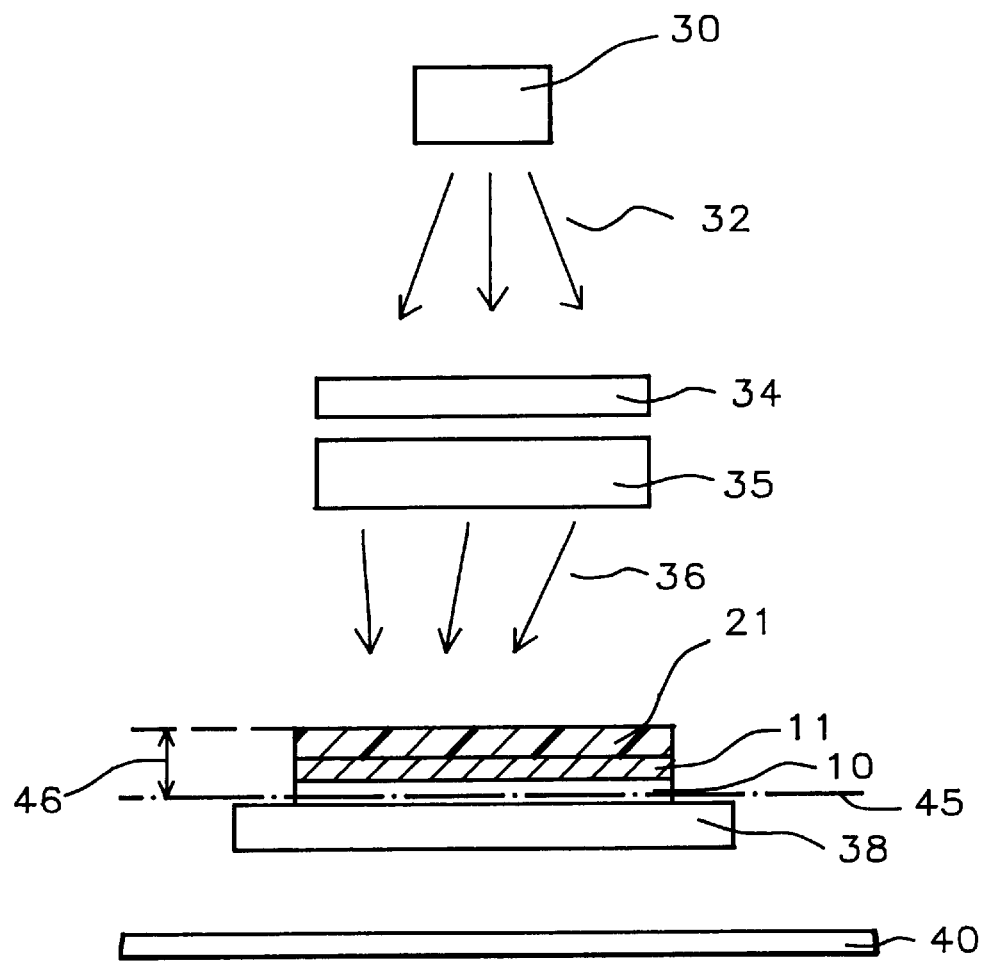
FIG. 5A shows a block diagram of a means to hold a wafer and mask and expose the wafer with the pattern contained in the mask when positive photoresist is used.
Figure 5B:
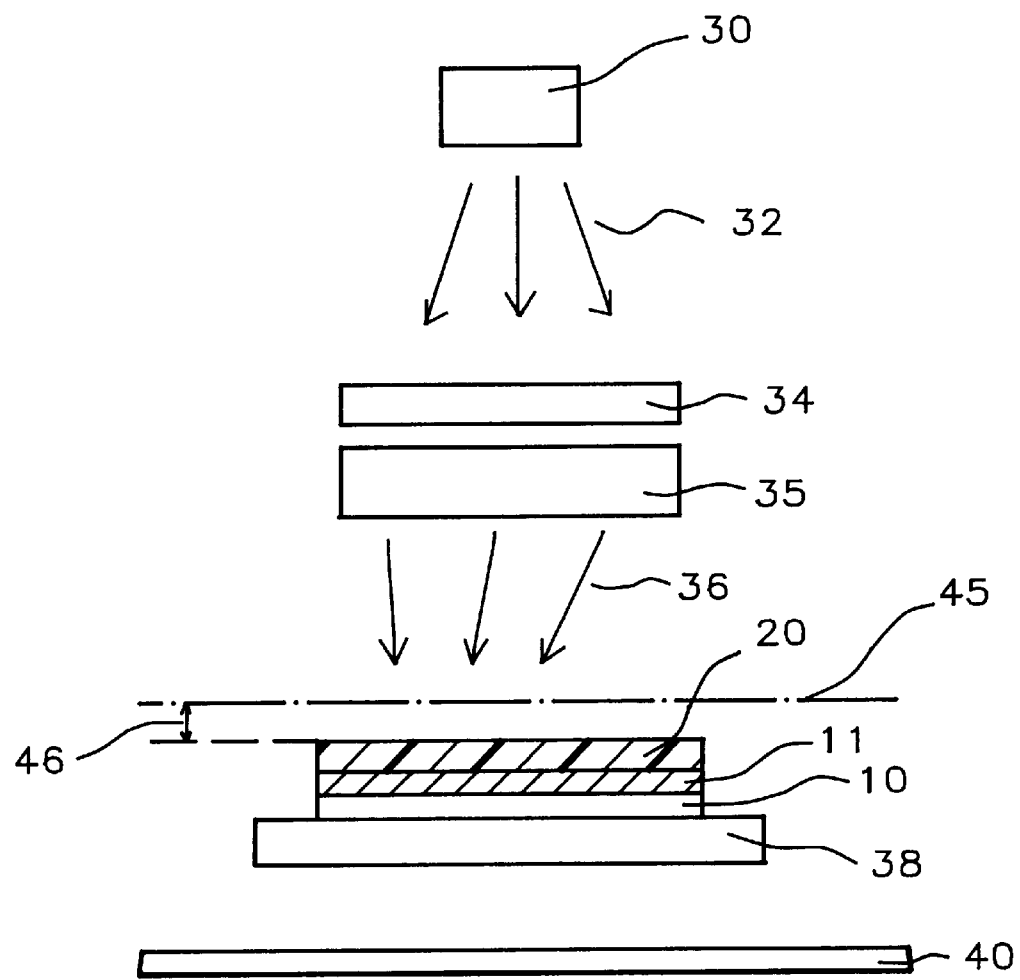
FIG. 5B shows a block diagram of a means to hold a wafer and mask and expose the wafer with the pattern contained in the mask when negative photoresist is used.

In order to carry out the next step, that of etching the electrode pattern into the layer of conducting material, the layer of photoresist 20 must be selectively exposed and developed. Block diagrams of means, such as a wafer stepper, to selectively expose the layer of photoresist is shown in FIGS. 5A and 5B. FIG. 5A shows an integrated circuit wafer 10, with the layer of conducting material 11 formed on the wafer and a layer of positive photoresist 21 formed on the layer of conducting material 11, held in place by a wafer holder 38. FIG. 5B shows an integrated circuit wafer 10, with the layer of conducting material 11 formed on the wafer and a layer of negative photoresist 20 formed on the layer of conducting material 11, held in place by a wafer holder 38. A mask containing the electrode pattern to be transferred to the layer of photoresist is held in a mask holder 34. A light source 30 generates light 32 which illuminates the mask and passes through the transparent regions of the mask. A lens 35 focusses the light passing through the mask and the lens so that the electrode pattern image is focussed at a focal plane 45 which is parallel to the layer of photoresist. The wafer holder 38 is positioned above a reference plane 40 in order to selectively expose the layer of photoresist 20.

FIG. 5A shows the arrangement used when the layer of photoresist 21 is a positive photoresist. In FIG. 5A the wafer holder 38 is positioned such that the top surface of the layer of positive photoresist 21 is a de-focus distance 46 above the focal plane 45, where the image of the electrode pattern is focussed, and the layer of positive photoresist 21 is exposed. In this example the de-focus distance 46 is between about 0.4 and 0.8 micrometers. The layer of photoresist is then developed to form an electrode pattern mask. The electrode pattern is then etched in the layer of conducting material using dry etching.

FIG. 5B shows the arrangement used when the layer of photoresist 20 is a negative photoresist. In FIG. 5B the wafer holder 38 is positioned such that the top surface of the layer of negative photoresist 20 is a de-focus distance 46 below the focal plane 45, where the image of the electrode pattern is focussed, and the layer of negative photoresist 20 is exposed. In this example the de-focus distance 46 is between about 0.4 and 0.8 micrometers. The layer of negative photoresist 20 is then developed to form an electrode pattern mask. The electrode pattern is then etched in the layer of conducting material using dry etching.

Figure 6:
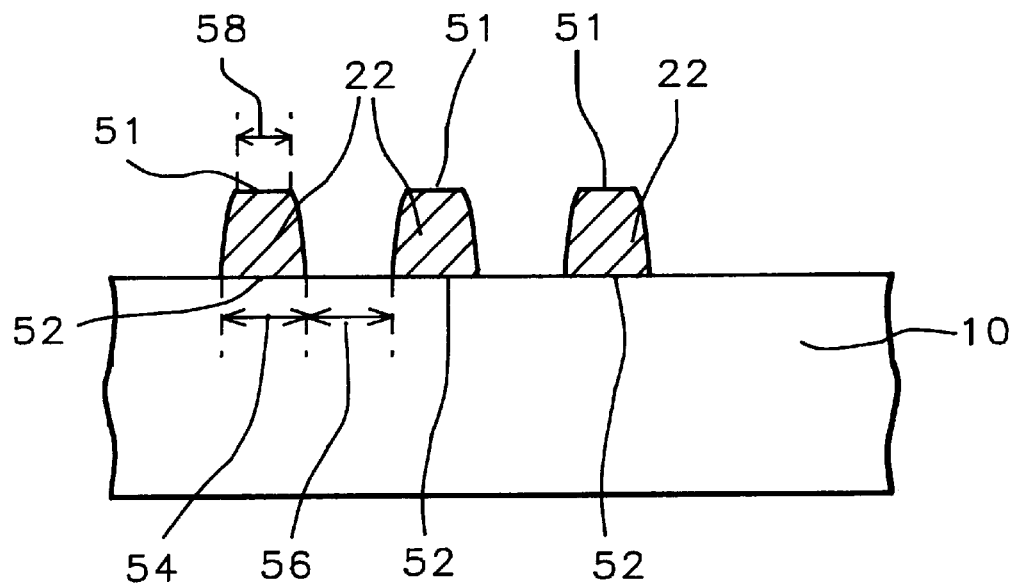
FIG. 6 shows a cross section view of electrodes formed using the de-focus methods of this invention.

FIG. 6 shows a cross section view of a part of the wafer after forming the electrode pattern using the de-focus method of this invention. The cross section of the electrodes 22 have a trapezoidal shape wherein the for each electrode the bottom of the electrode 52 is wider than the top 51 of the electrode. In this example the width 54 of the bottom of each electrode 52 is between about 1.0 and 1.1 micrometers, the width 58 of the top of each electrode is between about 0.9 and 1.1 micrometers and the distance 56 between adjacent electrodes, measured at the bottom of the electrode is between about 0.9 and 1.1 micrometers.

Figure 7:
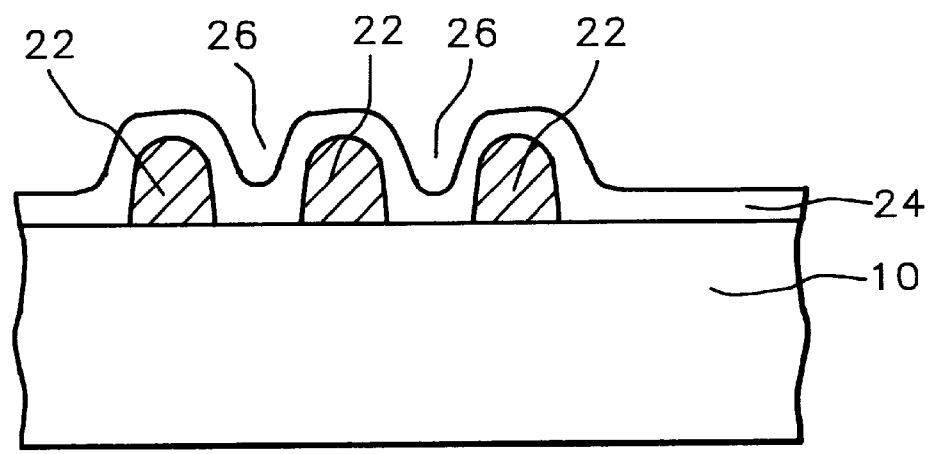
FIG. 7 shows a cross section view of electrodes formed using the de-focus methods of this invention after forming a conformal dielectric coating over the electrodes.

Next, as shown in FIG. 7, a conformal layer of dielectric material 24 is formed over the wafer. In this example the conformal layer of dielectric material 24 is a layer of oxide or nitride having a thickness of between about 12,000 and 13,000 Angstroms and deposited using plasma enhanced chemical vapor deposition. Using this method the spaces 26 between adjacent electrodes are open and not restricted and keyholes do not form. This avoids the problem of processing residues, such as photoresist residue, from being trapped in the region between electrodes and leading to problems during layer process steps.

Since the electrodes formed are trapezoidal in shape rather than rectangular there will be some increase in the resistance of the electrodes. We have found the increase in resistance to be between about 20% and 30% and that adequate conductance of the electrodes can be easily maintained.

While the invention has been particularly shown and described with reference to the preferred embodiments thereof, it will be understood by those skilled in the art that various changes in form and details may be made without departing from the spirit and scope of the invention.

What is claimed is:

1. A method of patterning a layer of conducting material, comprising the steps of:

providing an integrated circuit wafer having devices formed therein;

forming a layer of conducting material on said integrated circuit wafer;

forming a layer of photoresist on said layer of conducting material wherein said layer of photoresist is negative or positive photoresist;

providing a projection mask wherein said mask contains a conductor pattern;

providing means to illuminate said mask with a light source so that said light selectively passes through said mask, providing means to focus said light selectively passing through said mask whereby said conductor pattern is focussed at a focal plane;

providing means to hold said integrated circuit wafer wherein said layer of photoresist is parallel to said focal plane;

providing means to adjust the position of said layer of photoresist relative to said focal plane;

adjusting the position of said layer of photoresist relative to said focal plane so that said layer of photoresist is a de-focus distance from said focal plane;

exposing said layer of photoresist using said conductor pattern focussed at said focal plane after adjusting the position of said layer of photoresist relative to said focal plane;

developing said layer of photoresist after exposing said layer of photoresist thereby forming a photoresist mask of said conductor pattern;

etching said conductor pattern in said layer of conductor material using vertical anisotropic etching and said photoresist mask;

removing said photoresist mask; and forming a layer of dielectric over said integrated circuit wafer after etching said conductor pattern in said layer of conductor material and removing said photoresist mask.

2. The method of claim 1 wherein said layer of conducting material is aluminum/copper.

3. The method of claim 1 wherein said layer of conducting material is aluminum/copper/silicon.

4. The method of claim 1 wherein said layer of dielectric is a layer of oxide formed using plasma enhanced chemical vapor deposition.

5. The method of claim 1 wherein said layer of dielectric is a layer of nitride formed using plasma enhanced chemical vapor deposition.

6. The method of claim 1 wherein said conductor pattern etched in said layer of conductor comprises a number of electrodes wherein the separation between nearest adjacent said electrodes is between 0.9 and 1.1 micrometers.

7. The method of claim 1 wherein said layer of photoresist is between said focal plane and said projection mask.

8. The method of claim 7 wherein said layer of photoresist is a layer of positive photoresist.

9. The method of claim 7 wherein said de-focus distance is between 0.4 and 0.8 micrometers.

10. The method of claim 1 wherein said focal plane is between said layer of photoresist and said projection mask.

11. The method of claim 10 wherein said layer of photoresist is a layer of negative photoresist.

12. The method of claim 10 wherein said de-focus distance is between 0.4 and 0.8 micrometers.

* * * * *